United States Patent
Lee et al.

(10) Patent No.: US 11,894,079 B2
(45) Date of Patent: Feb. 6, 2024

(54) MEMORY CONTROLLER, MEMORY SYSTEM WITH IMPROVED THRESHOLD VOLTAGE DISTRIBUTION CHARACTERISTICS, AND OPERATION METHOD

(71) Applicant: SAMSUNG ELECTRONICS CO., LTD., Suwon-si (KR)

(72) Inventors: Hyeji Lee, Hwaseong-si (KR); Raeyoung Lee, Suwon-si (KR); Jinkyu Kang, Seoul (KR); Sejun Park, Yongin-si (KR); Jaeduk Lee, Seongnam-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 17/384,219

(22) Filed: Jul. 23, 2021

(65) Prior Publication Data
US 2022/0139474 A1   May 5, 2022

(30) Foreign Application Priority Data

Oct. 29, 2020   (KR) .................. 10-2020-0142526

(51) Int. Cl.
*G11C 16/34*   (2006.01)
*G11C 16/26*   (2006.01)
*G11C 16/10*   (2006.01)

(52) U.S. Cl.
CPC ........ *G11C 16/3463* (2013.01); *G11C 16/102* (2013.01); *G11C 16/26* (2013.01); *G11C 16/3404* (2013.01)

(58) Field of Classification Search
CPC ... G11C 16/3463; G11C 16/102; G11C 16/26; G11C 16/3404
See application file for complete search history.

(56) References Cited

U.S. PATENT DOCUMENTS

| 9,128,822 | B2* | 9/2015 | Michael ................ G06F 3/0679 |
| 9,847,122 | B2 | 12/2017 | Choi et al. |
| 10,163,523 | B2 | 12/2018 | Won et al. |
| 10,825,529 | B2* | 11/2020 | Hsu ......... G11C 16/16 |
| 10,885,993 | B2* | 1/2021 | Lee ..................... G11C 16/3459 |
| 2016/0118126 | A1* | 4/2016 | Moon ................... G11C 16/12 |
| | | | 711/103 |
| 2016/0314844 | A1* | 10/2016 | Dutta .................... G11C 16/26 |
| 2020/0035313 | A1 | 1/2020 | Shukla et al. |

(Continued)

FOREIGN PATENT DOCUMENTS

KR   1020150018732   10/2020

*Primary Examiner* — Vanthu T Nguyen
(74) *Attorney, Agent, or Firm* — Fish & Richardson P.C.

(57) ABSTRACT

A memory controller includes an over-program controller that preprograms and then erases the memory cells such that each of the memory cells has a first threshold voltage level, wherein fast cells are detected among the memory cells according to a threshold voltage less than or equal to a second threshold voltage less than the first threshold voltage, and a processor that generates fast cell information identifying the fast cells among the memory cells and stores the fast cell information in a buffer. The over-program controller controls the over-programming of the fast cells and normal programming of normal cells among the memory cells based on the fast cell information stored in the buffer.

15 Claims, 24 Drawing Sheets

(56) References Cited

U.S. PATENT DOCUMENTS

| | | |
|---|---|---|
| 2020/0089566 A1 | 3/2020 | You et al. |
| 2020/0185047 A1 | 6/2020 | Lee |
| 2020/0194063 A1 | 6/2020 | El Gamal et al. |
| 2020/0202960 A1 | 6/2020 | Yun et al. |
| 2020/0218606 A1 | 7/2020 | Ji et al. |

* cited by examiner

MEMORY CONTROLLER, MEMORY SYSTEM WITH IMPROVED THRESHOLD VOLTAGE DISTRIBUTION CHARACTERISTICS, AND OPERATION METHOD

CROSS-REFERENCE TO RELATED APPLICATION

This application claims priority under 35 U.S.C. § 119 to Korean Patent Application No. 10-2020-0142526 filed on Oct. 29, 2020 in the Korean Intellectual Property Office, the subject matter of which is hereby incorporated by reference.

BACKGROUND

The inventive concept relates to memory systems, and more particularly, to memory system and associated memory controllers providing improved threshold voltage distribution characteristics, as well as operating methods for same.

A memory system may include a memory controller and a memory device. A nonvolatile memory device includes nonvolatile memory cells configured to store data. For example, a flash memory includes nonvolatile, flash memory cells capable of being programmed and/or read according to different threshold voltages.

However, memory cells may deteriorate over time or as the result of various factors. The degree of deterioration for each memory cell may vary according to structural characteristics, performance and/or environmental conditions. That is, when memory cells are programmed under the same conditions, the reliability of data may vary according individual memory cells.

SUMMARY

Embodiments of the inventive concept provide memory controllers, memory systems, and related operating methods whereby fast cells (or memory cells expected to rapidly deteriorate) are over-programmed to improve threshold voltage distribution characteristics.

In order to achieve this and other object(s), according to one aspect of the inventive concept, a method of operating a memory system includes; detecting a fast cell among the memory cells after preprogramming and erasing the memory cells to define a first threshold voltage for each of the memory cells, wherein the fast cell has a threshold voltage less than or equal to a second threshold voltage less than the first threshold voltage, and over-programming the fast cell to set a threshold voltage of the fast cell to a third threshold voltage greater than the second threshold voltage level.

According to another aspect of the inventive concept, a memory controller of a memory device includes; an over-program controller configured to preprogram and then erase the memory cells such that each of the memory cells has a first threshold voltage level, wherein fast cells are detected among the memory cells according to a threshold voltage less than or equal to a second threshold voltage less than the first threshold voltage, and a processor configured to generate fast cell information identifying the fast cells among the memory cells and store the fast cell information in a buffer, wherein the over-program controller is further configured to control the over-programming of the fast cells and normal programming of normal cells among the memory cells based on the fast cell information stored in the buffer.

According to another aspect of the inventive concept, a memory device includes; a memory cell array including a first block of first memory cells and a second block of second memory cells, and control logic configured to pre-program and then erase the first memory cells such that each of the first memory cells has a first threshold voltage level, wherein fast cells are detected among the memory cells according to a threshold voltage less than or equal to a second threshold voltage less than the first threshold voltage, wherein the control logic is further configured to generate fast cell information associated with the fast cells and store the fast cell information in the second block, and upon receiving a program command directed to the first memory cells, over-programming the fast cells by referencing the fast cell information stored in the second memory cells.

BRIEF DESCRIPTION OF THE DRAWINGS

Embodiments of the inventive concept will be more clearly understood from the following detailed description taken in conjunction with the accompanying drawings in which.

DETAILED DESCRIPTION

Hereinafter, embodiments of the inventive concept will be described in some additional detail with reference to the accompanying drawings.

Figure 1:
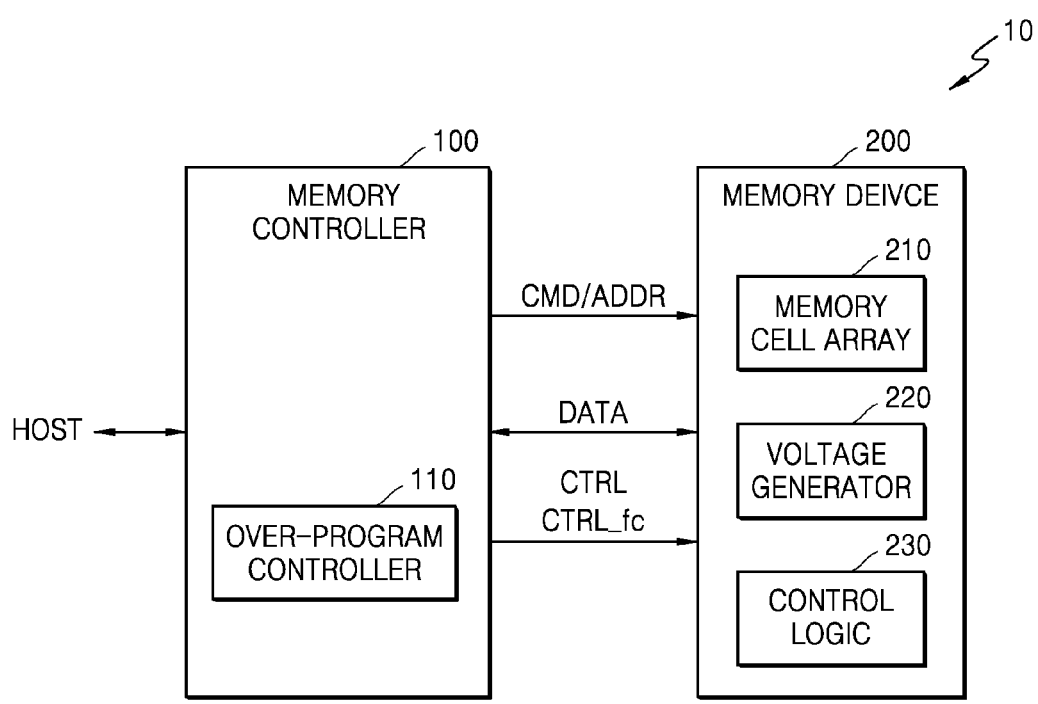
FIG. 1 is a block diagram illustrating a memory system 10 according to embodiments of the inventive concept.

Figure (FIG. 1 is a block diagram illustrating a memory system 10 according to embodiments of the inventive concept.

Referring to FIG. 1, the memory system 10 may generally include a memory controller 100 and a memory device 200, wherein the memory device 200 may include a memory cell array 210, a voltage generator 220 and a control logic 230.

Here, the memory device 200 may include one or more nonvolatile memory device(s). In some embodiments, the memory system 10 may be implemented as an internal memory embedded in an electronic device, such as, for example, an embedded universal flash storage (UFS) memory device, an embedded multi-media card (eMMC), a solid state drive (SSD), etc. Alternately, the memory system 10 may be implemented as an external memory (attachable/detachable) to an electronic device, such as, for example, a UFS memory card, a compact flash (CF) card, a secure digital (SD) card, a micro secure digital (Micro-SD) card, a Mini Secure Digital (mini-SD) card, an extreme digital (xD) card, a memory stick, etc.

The memory controller 100 may be used to control the overall operation (including at least (e.g.,) read operations, program (or write) operations and erase operations) response to various request(s) received from a host (HOST). That is, the memory controller 100 may define and control the execution of various operations performed by the memory device 200 in accordance with (e.g.,) address(es) (ADDR), command(s) (CMD), and control signal(s) (CTRL) provided by the memory controller 100. In addition, data (DATA) (including (e.g.,) at least read data retrieved during a read operation, and write data to be programmed during a program operation) may be communicated (e.g., transmitted and/or received) between the memory controller 10 and the memory device 200.

The memory cell array 210 may include a considerable number of memory cells. These memory cells may include (e.g.,) flash memory cells, resistive memory cells (e.g., resistive RAM (ReRAM) memory cells), phase change memory cells (e.g., PRAM memory cells), and/or magnetic memory cells (e.g., MRAM memory cells).

The memory cells of the memory cell array 210 may be arranged according to memory blocks (or simply, "blocks"). In some embodiments, the memory cells of a particular block may be further arranged in pages, wherein each page includes a defined number of memory cells. In some embodiments including flash memory cells, portions of the memory cell array 210 may be erased by an erase operation performed according to block unit(s), and other portions of the memory cell array 210 may be programmed or read according to page unit(s). As an example, the memory device 200 may perform an erase operation in block units, and perform a program operation and/or a read operation in page units with reference to address(es) provided by the memory controller 100.

The voltage generator 220 may be used to generate various voltages using during the operations performed by the memory device 200. As an example, a program operation may be performed using an incremental step pulse program (ISPP) voltage generated by the voltage generator 220 and including a sequence of voltage pulses provided to the memory cell array 210. Alternately, a program operation may be performed using number of program operations, each using a plurality of voltage pulses. Here, after each program operation is performed, a verification operation may be performed to determine a programming result (e.g., pass or fail). In this regard, the voltage generator 220 may generate a verification voltage used during the verification operation. Additionally, the voltage generator 220 may generate read voltage(s) used during read operations, and erase voltage(s) used during erase operations.

The control logic 230 may control the overall operation of the memory device 200 in relation to various memory operations. As an example, the control logic 230 may control the operation of the voltage generator 220 in variously generating a multiplicity of voltages, wherein each of these voltages may have one or more defined level(s), timing relationship(s), and a resulting shape.

Of particular note, the threshold voltage distribution of memory cells in the memory cell array 210 may be adjusted (or changed) in accordance with the application of one or more voltage(s) generated by the voltage generator 220 under the control of the control logic 230.

Those skilled in the art understand that the threshold voltage distribution of memory cells may deteriorate over time or for a variety of causes, and the deterioration of the threshold voltage distribution reduces the reliability of the memory device 200. Therefore, in order to maintain the intended programmed data values over time (e.g., to provide accurate read data), it is necessary to prevent or mitigate the deterioration of the threshold voltage distribution. In some embodiments, this effort involves the detection and remedy of deteriorated memory cells. For example, certain memory cells that are known (or expected) to deteriorate quickly may be distinguished from other cells and may be programmed and/or read differently from the other cells.

According to embodiments of the inventive concept, certain memory cells having threshold voltage distribution(s) expected to deteriorate (hereafter referred to as "fast cells", whereas memory cells other than fast cells are referred to as "slow cells" or "normal cells") may be pre-identified (e.g., before performing a program operation), and thereafter, during a program operation directed to these memory cells, a supplemental program operation may be performed to remedy deterioration of the memory cells. In some embodiments, this supplemental program operation may draw upon identified information associated with the memory cells, thereby improving overall reliability of data.

In some embodiments, the detection of fast cells among the memory cells of the memory cell array 210 may reference an "erase speed" for the memory cells. During wafer processing, characteristics of the memory cells of the memory cell array 210 may vary according to many different factors. For example, some memory cells may exhibit a relatively fast erase speed while other memory cells exhibit a relatively slow erase speed in response to a commonly applied erase voltage. In this regard, memory cells exhibiting faster erase speeds are more likely to yield a deteriorated threshold voltage distribution more quickly than other memory cells exhibiting slower erase speeds.

Here, fast cells may be identified as memory cells that are more rapidly erased when an erase voltage is applied. Accordingly, program operation(s) directed to fast cells (hereafter, an "over-program") and program operation(s) directed to slow cells (hereafter, a "normal program") may be differently defined. For example, an over-program operation may include a series (or sequence) of operations, such that the threshold voltage level of the fast cell is programmed to a higher level than the threshold voltage level of normal cells. By differently defining the over-program and the normal program, deterioration of fast cells may be prevented or remedied, thereby improving the reliability of data.

Referring to FIG. 1, the memory controller 100 may include an over-program controller 110, wherein the over-program controller 110 may be used to distinguish (or "detect") fast cells from the normal cells. For example, before performing a program operation, the over-program controller 110 may detect fast cells by performing a fast cell detection operation, and thereafter storing the resulting information identifying the detected fast cells (hereafter, "fast cell information") for later reference by the memory controller 100. Thereafter, upon receiving a program request directed to a particular memory cell from the host, the memory controller 100 may perform a program operation on the particular memory cell using the stored fast cell information. In this regard, the fast cell detection operation need not necessarily be performed immediately upon (or in direct response to) receiving a program request from the host. However, in some embodiments, the memory controller 100 may perform the fast cell detection operation upon receiving a program request from the host.

The over-program controller 110 may generate various information necessary to the performance of the fast cell detection operation, and provide the information to the memory device 200 in the form of a "fast cell control signal" (CTRL_fc). Here, the fast cell control signal provided to the memory device 200 may include (e.g.,) a first control signal including voltage information that may be used to detect fast cells. Alternately or additionally, the first control signal may include configuration information allowing the memory device 200 to more efficiently detect fast cells. The fast cell control signal provided to the memory device 200 may include (e.g.,) a second control signal including voltage information that may be used to over-program fast cells. Alternately or additionally, the second control signal may also include configuration information allowing the memory device 200 to more efficiently perform the over-program of fast cells.

In some embodiments, one or both of the normal program and over-program may use an ISPP approach. In this regard, the over-program controller 110, in order to distinguish between the over-program and the normal program, may change at least one of a start level for a voltage pulse (or ISPP start voltage level), a level of a verification voltage, a number of ISPP voltage pulses to-be-applied to a particular memory cell, a voltage increase size (or step), etc. Here, the second control signal may further include such "ISPP change information."

In the illustrated example of FIG. 1, the over-program controller 110 is assumed to be provided by the hardware, firmware and/or software implementing the memory controller 100. However, this need not always be the case, and the over-program controller 110 may be provided external to the memory controller 100, within the memory device 200, etc. One embodiments wherein the over-program controller 110 is included in the memory device 200 will be described in some additional detail with reference to FIG. 13.

Figure 2:
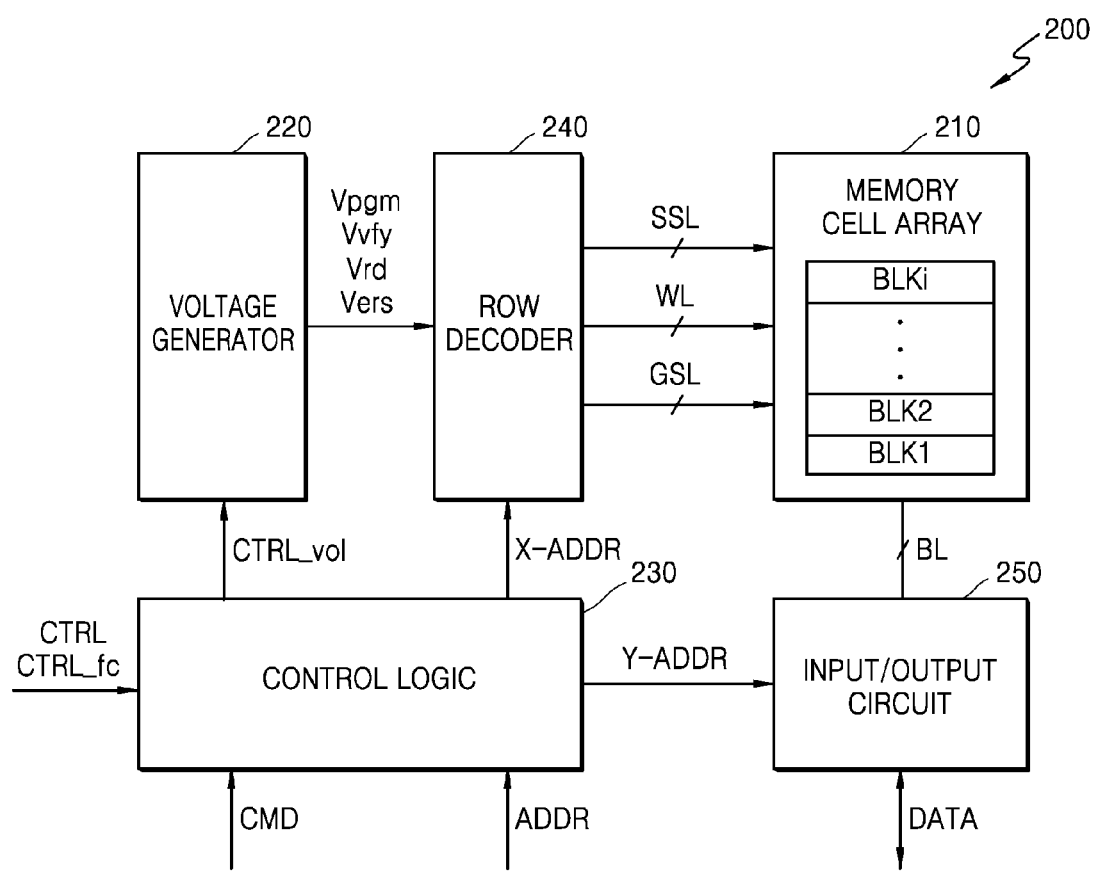
FIG. 2 is a block diagram further illustrating the memory device 200 of FIG. 1.

FIG. 2 is a block diagram further illustrating in one example the memory device 200 of FIG. 1.

Referring to FIGS. 1 and 2, the memory device 200 may include a memory cell array 210, a voltage generator 220, a control logic 230, a row decoder 240, and an input/output (I/O) circuit 250. Those skilled in the art will appreciate that the memory device 200 may further include various other components related to memory system operations, such as a page buffer, buffer(s), register(s), other I/O interface(s), etc.

The memory cell array 210 may include blocks BLK1 to BLKi, and the memory cells of the blocks BLK1 to BLKi may be connected to word lines WL, string select lines SSL, ground select lines GSL, and bit lines BL. The memory cell array 210 may be connected to the row decoder 240 through word lines WL, string select lines SSL, and ground select lines GSL, and may be connected to the page buffer through bit lines BL. Each of the memory cells may store one or more bits. Here, the memory cells provided by the memory cell array 210 may include single level memory cells (SLC) and/or multi-level memory cells (MLC) including (e.g.,) triple level memory cells (TLC) and/or quad-level memory cells (QLC).

In some embodiments, the memory cell array 210 may be a two-dimensional (2D) memory cell array including cell strings arranged in rows and columns. Alternately, the memory cell array 210 may be a three dimensional (3D) memory cell array including vertically arranged cell strings. In this regard, the subject matter of U.S. Pat. Nos. 7,679,133; 8,553,466; 8,654,587 and 8,559,235, as well as published U.S. Patent Application No. 2011/0233648 is hereby incorporated by reference.

As noted above, a variety of methods may be used by the over-program controller 110 to detect fast cells. For example, fast cells may be detected in relation to a number of performance related characteristics (e.g., erase speed, program speed, etc.) and/or structural characteristics associated with particular memory cell(s).

Assuming a 3D memory cell array, the program speed and/or erase speed of memory cells more centrally located in relation to a channel hole arrangement (hereafter, "inner cells") may be different than the program speed and/or erase speed of memory cells less centrally (i.e., more outwardly) located in relation to the channel hole arrangement (hereafter, "outer cells"). For example, the erase speed outer cells may be faster than the erase speed of inner cells. Accordingly, in some embodiments, the over-program controller 110 may identify outer cells as fast cells. That is, the over-program controller 110 may detect and store location information related to memory cells based on their relative position to a channel hole, and this "position information" may be used to detect fast cells. Such position information for memory cells may be included in the first control signal of the fast cell control signal (CTRL_fc) received by the control logic 230.

The control logic 230 may output various internal control signals used to variously program, verify and/or read memory cells of the memory cell array 210 in response to command(s) (CMD), address(es) (ADDR) and/or control signal(s) (CTRL) received from the memory controller 100. For example, the control logic 230 may output a voltage control signal (CTRL_vol) configured to control the generation of various voltages by the voltage generator 220, a row address (X-ADDR) to the row decoder 240, and a column address (Y-ADDR) to the I/O circuit 250.

Here, the voltage generator 220 may generate various voltages used by the memory device 200, such as program voltage(s) (Vpgm), verification voltage(s) (Vvfy), read voltage(s) Vrd, erase voltage(s) (Vers), etc.

In this regard upon receiving the fast cell control signal (CTRL_fc) from the memory controller 100, the control logic 230 may adjust one or more characteristics of an ISPP signal (e.g., a start voltage level, a number of ISPP voltage pulses to-be-applied to the memory cell, etc. The fast cell control signal may further include configuration information associated with at least one of a read operation, an erase operation, and a program operation.

The control logic 230 may control various voltage levels using a voltage control signal (CTRL_vol) and in response to the fast cell control signal (CTRL_fc). In this regard, the voltage generator 220 may differently set various voltage levels applied to fast cells and normal cells in response to the voltage control signal.

For example, at least one of the program voltage Vpgm, the verification voltage Vvfy, the read voltage Vrd, and the erase voltage Vers used for the over-program may be distinguished from an analogous voltage level used for the normal program. As an example, the voltage generator 220 may generate an over-program verification voltage that is higher a normal program verification voltage. Alternately, in response to the second control signal, the voltage generator 220 may generate a greater number of ISPP voltage pulses during the over-program than during the normal program.

In some embodiments, the functionality described in relation to the over-program controller 110 may be provided in the control logic 230. In this case, the memory device 200 may be programmed with an on-chip buffered program algorithm. That is, the functionality of the over-program controller 110 may be implemented as an on-chip buffer program and stored in the memory device 200. Here, the term "on-chip buffer program" refers to a method of utilizing some of the data storage space provided by the memory device 200 as a buffer memory storing a competent controller program.

Fast cell information obtained by the over-program controller 110 through the fast cell detection operation (which may actually include a number of separate fast cell detection routines) may also be stored in pre-allocated block(s) of the memory cell array 210.

Figure 3:
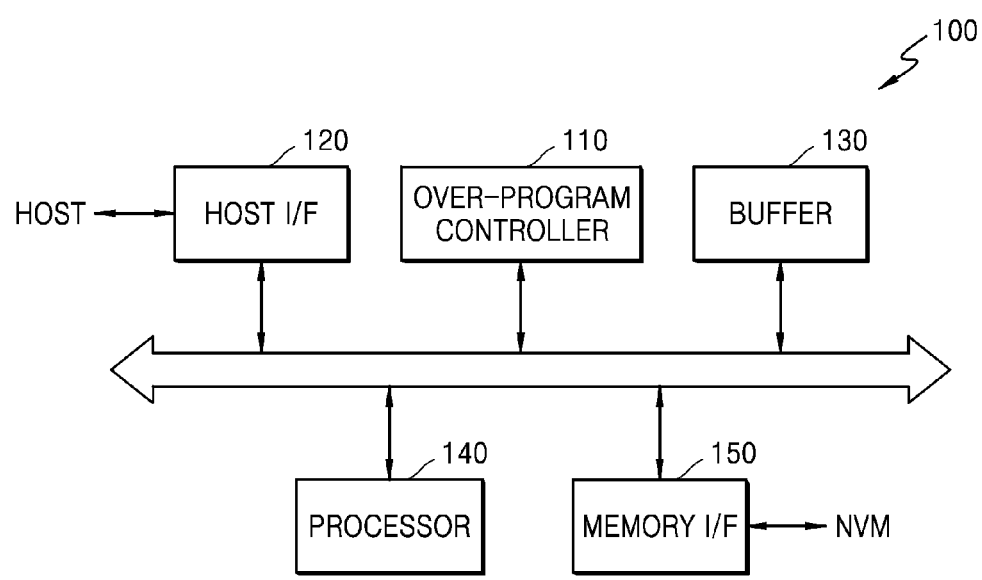
FIG. 3 is a block diagram further illustrating the memory controller 100 of FIG. 1.

FIG. 3 is a block diagram further illustrating in one example the memory controller 100 of FIG. 1.

Referring to FIGS. 1 and 3, the memory controller 100 may include an over-program controller 110, a host interface 120, a buffer 130, a processor 140 and a memory interface 150. These components may inter-communicate through one or more bus(es). In addition, although not shown in FIG. 3, the memory controller 100 may further include various other components, such as a RAM temporarily storing data and/or information, a ROM storing (in a nonvolatile manner) certain information.

In this regard, RAM may be used as a working memory, and the processor 140 may be used to control the overall operation of the memory controller 100 (e.g.,) by driving firmware loaded in RAM. RAM may be variously implemented using (e.g.,), a cache memory, DRAM, SRAM, PRAM and/or flash memory, etc. In addition, as an example of firmware, a flash translation layer (FTL) may be loaded in RAM, and various functions related to flash memory operations may be performed by driving the FTL.

The host interface 120 provides a physical connection between the host and the memory system 10. As an example, the host interface 120 may include various interface methods such as advanced technology attachment (ATA), serial ATA (SATA), external SATA (e-SATA), small computer small interface (SCSI), serial attached SCSI (SAS), peripheral component interconnection (PCI), PCI express (PCI-E), IEEE 1394, universal serial bus (USB), secure digital (SD) card, multi-media card (MMC), embedded multi-media card (eMMC), compact flash (CF) card interface, and the like.

The host interface 120 may receive a read/program request from the host and transmit data read from the memory device 200 to the host.

The buffer 130 may temporarily store data program-requested from the host and data read from the memory device 200. Also, the buffer 130 may be used as an operating memory or a cache memory of the processor 140.

The processor 140 may include a central processing unit or a microprocessor, and may control all operations of the memory controller 100 by executing instructions stored in the memory device 200. In some embodiments, the memory controller 100 may include; an over-program controller 110 configured to preprogram and then erase memory cells of the memory device 200, such that each of the memory cells has a first threshold voltage level. In this regard, fast cells may be detected among the memory cells according to a threshold voltage less than or equal to a second threshold voltage—which is less than the first threshold voltage. The processor 140 may be configured to generate fast cell information identifying the fast cells among the memory cells and store the fast cell information in a buffer. Here, the over-program controller 110 may be further configured to control the over-programming of the fast cells and normal programming of normal cells among the memory cells based on the fast cell information stored in the buffer.

The memory interface 150 provides a physical connection between the memory controller 100 and the memory device 200, such that various command(s), address(es) and/or data may be communicated between the memory controller 100 and the memory device 200 through the memory interface 150.

Here, the over-program controller 110 may generate various fast cell information and store the fast cell information in the buffer 130 in order to perform the fast cell detection operation in the memory device 200, and in order to perform over-program of the detected fast cells. For example, the buffer 130 may store fast cell information, such as voltage level(s) applied during the over-program, a number of voltage pulses, etc.

In addition, the buffer 130 may further include position location (e.g., related to a channel hole configuration) for memory cells that may be used to detect fast cells. Upon receiving a program request from the host directed to particular memory cell(s), the memory controller 100 may fetch the position information stored in the buffer 130 and determine whether to over-program or normal program the particular memory cell(s).

In some embodiments, the detection of fast cells by the over-program controller 110 may begin when the host interface 120 receives a program command from the host. That is, the over-program controller 110 may obtain fast cell information related to memory cells to be programmed (hereafter, "target memory cells") in response to a program request received from the host interface 120. In order to determine whether one or more fast cell(s) is included in the target memory cells, a fast cell detection operation may be performed. For example, a series of fast cell detection routines associated with (e.g.,) pre-programming, erasing and/or erase verification may be performed on the target memory cells. And, as a result of the fast cell detection operation, fast cells among the target memory cells to be appropriately detected and properly programmed.

However, in some embodiments, the fast cell information may have been predetermined and stored well before receipt of a program command. Hence, the over-program controller 110 may quickly determine whether one or fast cells is included in target memory cells by referring to the stored fast cell information.

As noted above, the over-program controller 110 may generate the second control signal including various control (e.g., voltage-defining) information (hereafter, "setting information"). Such setting information may include, for example, at least one of ISPP voltage level, a number of ISPP voltage pulses, a voltage increment (or step), etc.

Here, it should also be noted that normal cells (excluding fast cells) among the target cells may be programmed as normal cells, and corresponding setting information associated with normal cells may be included in control signal(s) CTRL routinely provided by the memory controller 100.

Hence, in some embodiments, the over-program controller 110 may provide both the normal control signal(s) CTRL and the fast cell control signal CTRL_fc to the memory device 200 through the memory interface 150.

As noted above, the over-program controller 110 may be implemented using firmware or software, but is not limited thereto, and may be implemented using hardware or a combination thereof. When the over-program controller 110 is implemented using firmware or software, the over-program controller 110 is loaded to the buffer 130, and the processor 140 may execute the over-program controller 110. Accordingly, the functionality described in relation to the over-program controller 110 may be variously performed.

Figure 4A:
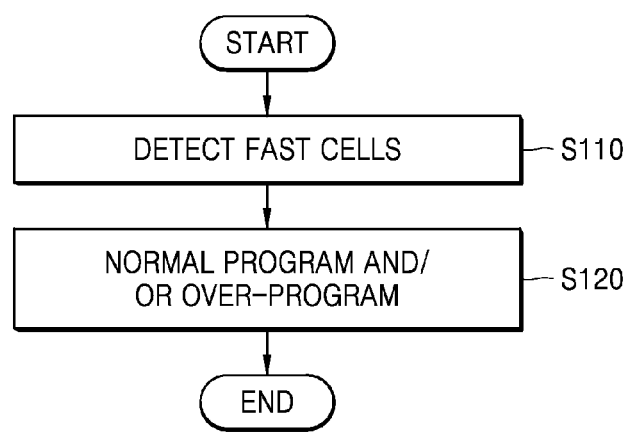
FIGS. 4A, 4B and 4C are respective flowcharts illustrating a method of operating a memory controller according to embodiments of the inventive concept.
Figure 4B:
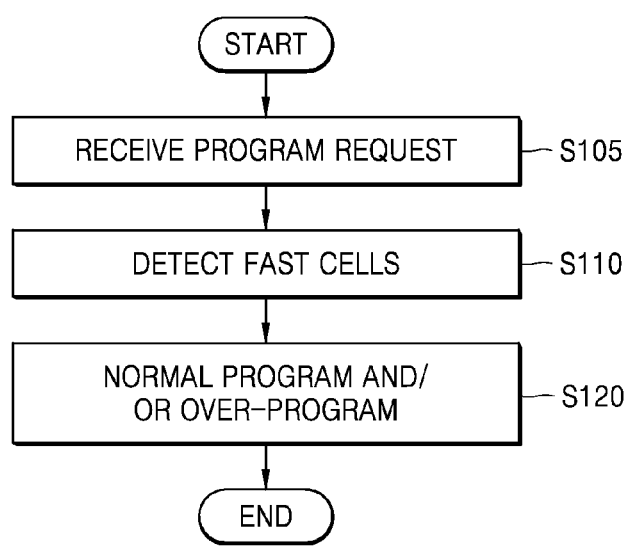
Figure 4C:
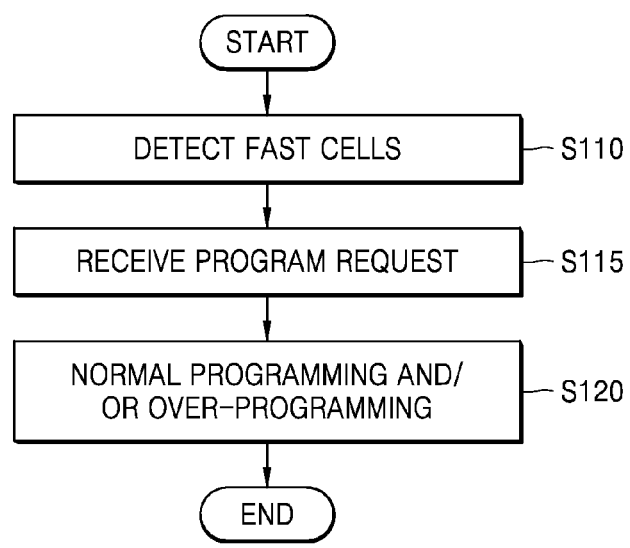

FIGS. 4A, 4B and 4C are respective flowcharts illustrating general methods of operating a memory controller according to embodiments of the inventive concept.

Referring to FIGS. 1, 2, 3 and 4A, the memory controller 100 may detect fast cells among some or all of the memory cells provided by the memory device 200 (S110).

In some embodiments, the detection of the fast cells may be accomplished by execution of a fast cell detection operation. For example, the memory controller 100 may apply a preprogram voltage to memory cells and then apply an erase voltage used during an erase operation. Thereafter, rapidly erased cells among the memory cells may be identified as fast cells through an erase verification operation or a read operation. Here, the memory controller 100 may perform the fast cell detection operation on all of the memory cells in the memory cell array 210. Alternately, the memory controller 100 may perform the fast cell detection operation some of the memory cells (e.g., one or more blocks) of the memory cell array 210. One example of a fast cell detection operation will be described in some additional detail in relation FIGS. 5A and 5B.

Alternately, as noted above for an example wherein the memory cell array 210 has a 3D structure, outer memory cells (relatively distant from a channel hole) may have a faster program speed and/or a faster erase speed than inner memory cells (relatively proximate to the channel hole). These outer memory cells may be identified as fast cells.

Once the fast cell detection operation has been performed, the memory controller 100 may store the resulting fast cell information one or more locations in the memory system 10. For example, the fact cell information may be stored in a buffer 130 of the memory controller 100 and/or in a designated block of the memory cell array 210. The fast cell information may include (e.g.,) address locations for the detected fast cells. The fast cell information may further include over-program information defining the over-program operation to be applied to the fast cells, as contrasted from normal program information defining the normal program operation to be applied to normal cells.

Once the fast cells are detected, the memory controller 100 may then normal program the normal cells with reference to the normal program information and/or over-program the fast cells with reference to the fast cell information (S120).

In some embodiments, the over-program may program a fast cell to have a threshold voltage that is higher than a threshold voltage generated by the normal program. For example, assuming a maximum application of N ISPP voltage pulses during the normal program, the over-program may allow the maximum application of M ISPP voltage pulses, where 'M' is greater than 'N', and both 'N' and 'M' are positive integers.

As a result, a threshold voltage distribution resulting from the over-program may be right-shifted, as compared with a threshold voltage distribution resulting from the normal program. Hence, over-programmed fast cells will have a higher threshold voltage than normal-programmed normal cells, such that even a leftward-shifted threshold voltage distribution for (an un-remediated) fast cell will nonetheless have a threshold voltage distribution approaching that of (or more similar to) the programmed normal cells.

As noted above, in some embodiments, memory cells of the memory cell array 210 may include SLC and/or MLC. For example, a TLC may be programmed (or erased) to have one of eight (8) different states including a first (lowest level) program state P1 to a (highest level) seventh program state P7, as well as an erase state E.

Here, the threshold voltage distribution associated with the seventh program state P7 of an over-programmed fast cell will be right-shifted, as compared with the threshold voltage distribution of the seventh program state P7 of a normal-programmed normal cell. Accordingly, even if the fast cell in the seventh program state P7 is deteriorated (thereby resulting in a left-shifted threshold voltage distribution), the threshold voltage distribution in the seventh program state P7 of the fast cells may be similar to that of the threshold voltage distribution in the seventh program state P7 of the normal cell.

In contrast with the embodiment of FIG. 4A, and referring now to FIGS. 1, 2, 3 and 4B, the memory controller 100 may receive a program request from the host (S105) before performing method steps (S110) and (S120), described above. Alternately, and referring now to FIGS. 1, 2, 3 and 4C, the memory controller 100 may perform the fast cell detection operation (S110) before receiving a program request from the host (S115). That is, upon receiving a program request from the host, the memory controller 100 may discriminate between fast cells and normal cells by referencing fast cell information stored in the memory system 10. Thereafter, the memory controller 100 may perform either normal programming of normal cells and/or over-programming of fast cells (S120)

Figure 5A:
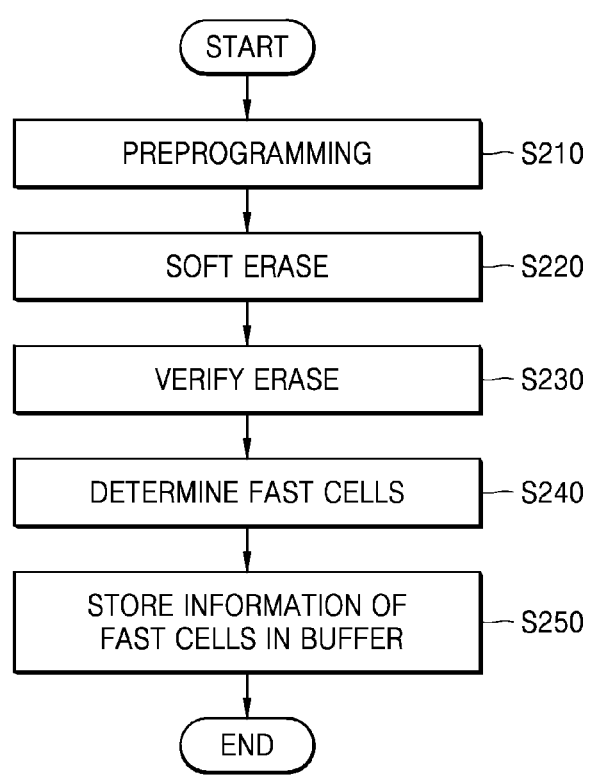
FIGS. 5A and 5B are flowcharts illustrating a fast cell detection operation according to embodiments of the inventive concept.
Figure 5B:
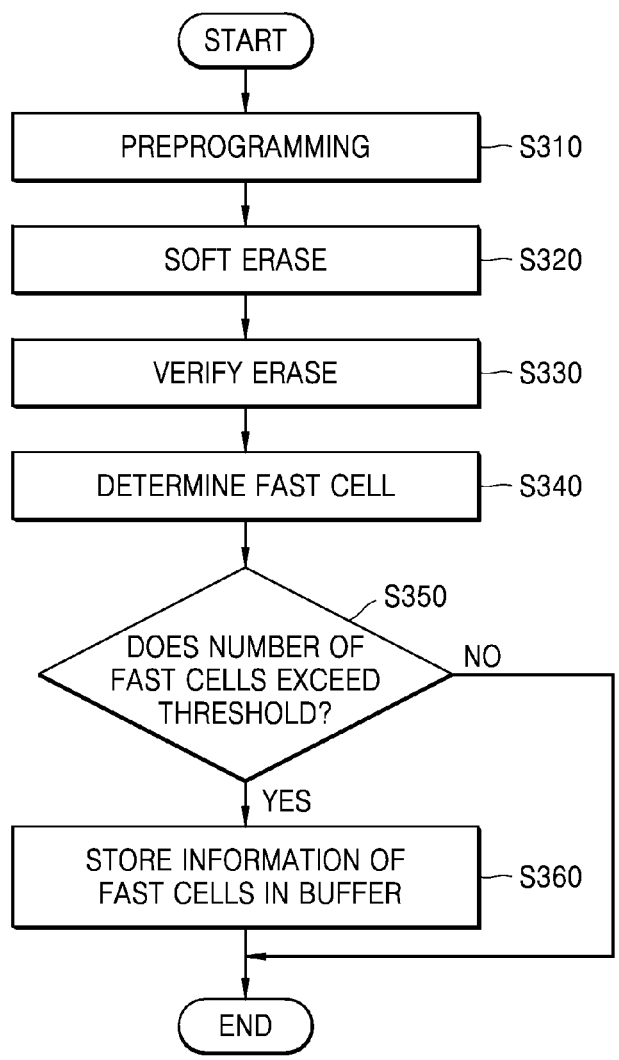

FIGS. 5A and 5B are respective flowcharts illustrating in examples a fast cell detection operation according to embodiments of the inventive concept.

Referring to FIGS. 1, 2, 3 and 5A, the memory controller 100 may preprogram memory cells (S210). In this context, "preprogramming" refers to an operation of collecting (or harmonizing) the threshold voltage distribution(s) of the memory cell into one program state prior to performing an erase operation on MLC. For example, a program voltage may be applied to the memory cells so that all of the memory cells have a preset first threshold voltage level (e.g., V1 in FIG. 6A). Of note, if the memory cells of the memory cell array 210 includes only SLC, step (S210) may be omitted. Alternately, if the memory cells of the memory cell array 210 include TLC, the memory controller 100 may collect memory cell voltage distributions—that may be one of eight (8) possible states—into one program distribution (e.g., the highest voltage distribution associated with the seventh program state P7).

Then, the memory controller 100 may perform soft erase on the preprogrammed memory cells (S220). Here, "soft erasing" refers an operation of erasing memory cells by applying a voltage having a level that is lower than the level of a voltage normally applied to erase memory cells. For example, the memory controller 100 may apply a soft erase voltage to word lines connected to the memory cells. In some embodiments and in contrast to incremental step pulse erase (ISPE) approaches that apply multiple erase voltage pulses, the memory controller 100 may apply a single (soft) erase voltage.

Next, the memory controller 100 may perform an erase verification operation on the memory cells (S230). For example, in order to determine whether the memory cells have now been set to a defined threshold voltage (e.g., V3 in FIG. 6B), an erase verification voltage may be applied to the memory cells. That is, the erase verification essentially verifies the results of the soft erase step (S220), so in other embodiments a read operation may be used instead of the verify erase operation.

The memory controller 100 may now determine whether each of the memory cells is a fast cell (S240).

For example, when the erase verification voltage (e.g., the third threshold voltage level V3 of FIG. 6B) is applied to the memory cells, as a result of the erase verification, memory cells in an ON-cell state (e.g., C1 in FIG. 6B) and memory cells in an OFF-cell state (e.g., C2 in FIG. 6B) may coexist. Hence, the memory cells C1 in the ON-cell state have been erased faster than the memory cells C2 in the OFF-cell state. Thus, the memory cells C1 in the ON-cell state may be identified as fast cells.

The memory controller 100 may now store fast cell information (S250). For example, the memory controller 100 may store the addresses of memory cells C1 having a threshold voltage level less than the third threshold voltage level V3 in the buffer 130.

Referring now to FIGS. 1, 2, 3 and 5B, the method steps S310 to S340 are analogously the same as the method steps S210 to S240 of FIG. 5A.

However, once the fast cells have been determined (S340), the memory controller 100 may further determine whether a number of fast cells exceeds a reference threshold (S350). In this regard, the reference threshold value may be determined with reference to the fast cell information stored in the buffer 130. Here, the reference threshold value will vary with performance and performance/structural characteristics of the memory system 10.

If the number of fast cells exceeds the reference threshold (S350=YES), the memory controller 100 may store the fast cell information in the buffer 130 (S360). However, if the number of fast cells is less than or equal to the reference threshold (S350=NO), the memory controller 100 may safely ignore the fast cell information. In this regard and in comparison with the embodiment of FIG. 5A, the stored fast cell information may or not be taken into operational consideration, depending on the operating speed and related performance factors (e.g., error detection and/or correction capabilities) of the memory system 10.

Figure 6A:
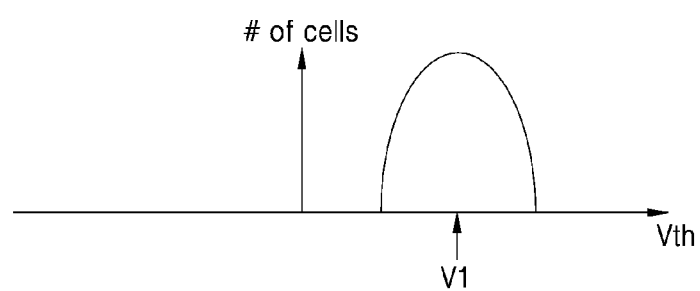
FIGS. 6A and 6B are respective threshold voltage diagrams further illustrating a fast cell detection method according to embodiments of the inventive concept.
Figure 6B:
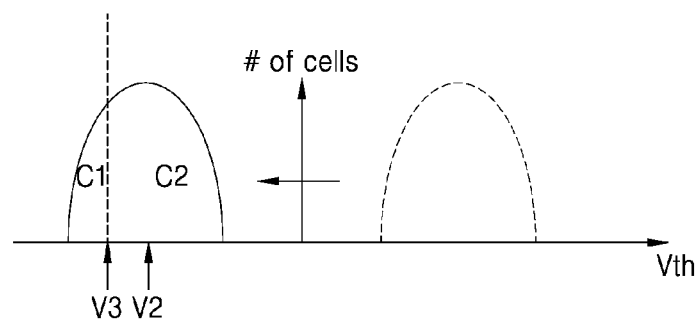

FIGS. 6A and 6B are conceptual diagrams further illustrating a method of detecting fast cells according to embodiments of the inventive concept.

Referring to FIGS. 1, 2, 3, 6A and 6B, the memory controller 100 may apply a program voltage to the memory cells to have a first threshold voltage level V1. As a result, the memory cells may have the threshold voltage distribution shown in FIG. 6A.

Thereafter, the memory controller 100 may apply an erase voltage to the memory cells. For example, the memory controller 100 may erase the memory cells to have a second threshold voltage level V2 shown in FIG. 6B. When the erase voltage is applied to the memory cells, the form of the threshold voltage distribution of the memory cells may be shifted to the left as shown in FIG. 6B.

The memory controller 100 may determine the erase result by applying a third threshold voltage level V3 to the memory cells as an erase verification voltage. The value of the third threshold voltage level V3 used as a reference for verifying erasing may be changed depending on characteristics and environments of memory cells. For example, the third threshold voltage level V3 may be a value less than the second threshold voltage level V2.

The memory controller 100 may determine memory cells C1 having threshold voltage levels equal to or less than (or less than) the third threshold voltage level V3 as fast cells. Accordingly, memory cells C2 having a threshold voltage level greater than (or equal to) the third threshold voltage level V3 may be determined to be normal cells.

Figure 7:
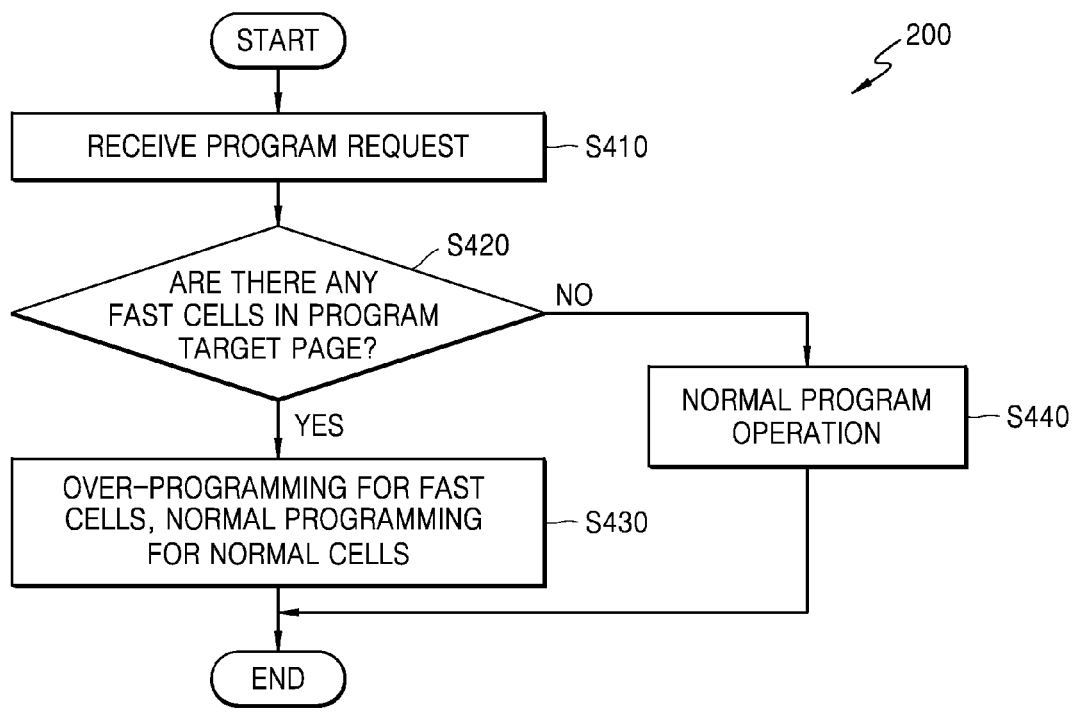
FIG. 7 is a flowchart illustrating a program operation according to embodiments of the inventive concept.

FIG. 7 is a flowchart illustrating a program operation according to embodiments of the inventive concept.

Referring to FIGS. 1, 2, 3, 4C and 7, the memory controller 100 may receive a program request from the host (S410) identifying a target page of memory cells.

The memory controller 100 may determine whether fast cells exists in the target page (S420). Here, the memory controller 100 may reference the fast cell information stored in the buffer 130 to determine whether one or more fast cells is included in the target page.

If fast cells are included in the target page (S420=YES), the memory controller 100 may perform an over-program for the fast cells and a normal program for the normal cells (S430). Here, for example, the memory controller 100 may generate the fast cell control signal CTRL_fc including the second control signal so that fast cells are over-programmed, and may further generate the control signal CTRL so that the normal cells are normal programmed. That is the memory controller 100 may provide both the fast cell control signal CTRL_fc and the control signal CTRL to the memory device 200. And the memory device 200 may perform program operations based on the fast cell control signal CTRL_fc and the control signal CTRL. Examples of the over-program operation will be described in some additional detail with respect to FIGS. 9A, 9B, 9C and 9D.

However, if there are no fast cells (or alternately, less than a prerequisite number) in the target page (S420=NO), the memory controller 100 may perform the normal program on the entire target page (S440). Examples of the normal program operation will be described in some additional detail with respect to FIGS. 8A to 8B.

Figure 8A:
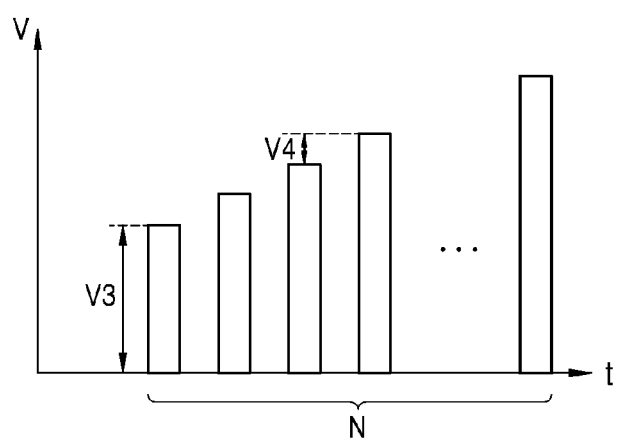
FIGS. 8A and 8B are programming voltage diagrams illustrating a normal program operation according to embodiments of the inventive concept.
Figure 8B:
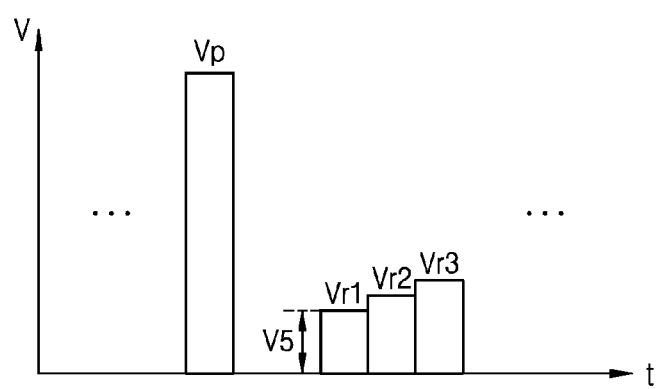
Figure 9A:
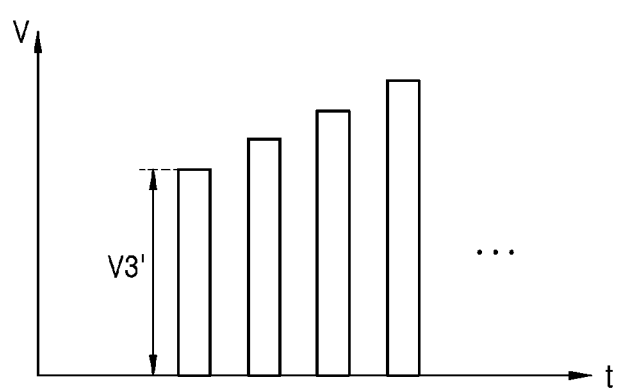
FIGS. 9A, 9B, 9C and 9D are respective over-programming voltage diagrams further illustrating an over-program operation according to embodiments of the inventive concept.
Figure 9B:
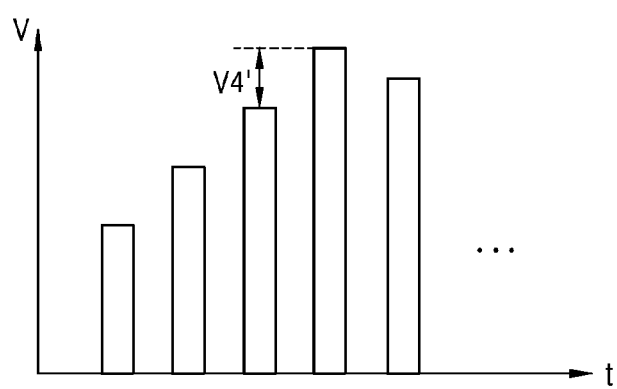
Figure 9C:
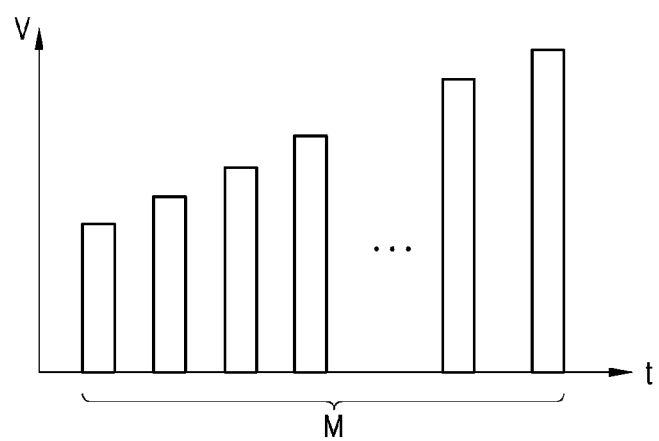
Figure 9D:
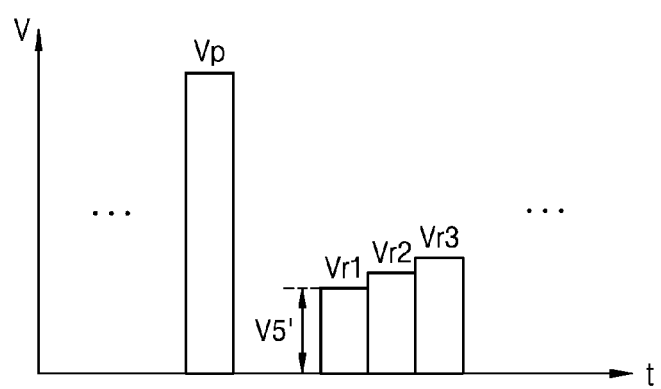

FIGS. 8A and 8B voltage waveform diagrams illustrating a normal program operation according to embodiments of the inventive concept.

Referring to FIGS. 1, 8A, and 8B, memory cells are assumed to be programmed using an ISPP method.

The normal program performed on the normal cells may be performed by the ISPP method including voltage pulses gradually increasing in level starting from the voltage level V3, and each voltage pulse may include the program voltage Vp and verification voltages Vr1, Vr2, and Vr3.

FIGS. 9A, 9B, 9C and 9D are waveform diagrams illustrating an over-program operation according to embodiments of the inventive concept.

Referring to FIGS. 1, 8A, 8B, and 9A to 9D, because the over-program operation aims to increase the threshold voltage level of the memory cells to be programmed compared to when the normal program operation is performed, the number of voltage pulses, the level of the program voltage, or the level of the verification voltage used in the over-program operation may be different from at least one of the number of voltage pulses, the level of the program voltage, or the level of the verification voltage used in the normal program operation.

For example, in the over-program operation, an ISPP start voltage level V3' may be greater than the ISPP start voltage level V3 in the normal program operation. As another example, an increase amount V4' of the ISPP voltage pulse may be greater than an increase amount V4 in the normal program operation. As another example, the number M of ISPP voltage pulses applied to the memory cells may be greater than the number N of pulses applied in the normal program operation. As another example, a level V5' of the program verification voltage may be greater than a level V5 of the program verification voltage applied in the normal program operation.

The over-program operation may include any one of the above-described embodiments or may include at least two operations. For example, the over-program operation may have a greater number of ISPP voltage pulses than the normal program operation, and at the same time, may also have a greater value than the program verification voltage level.

That is, because the over-program operation is performed differentially from the normal program operation in order to increase the threshold voltage level of the memory cell, it is not limited to the above-described embodiment, and may include various operations for increasing the threshold voltage level.

Figure 10A:
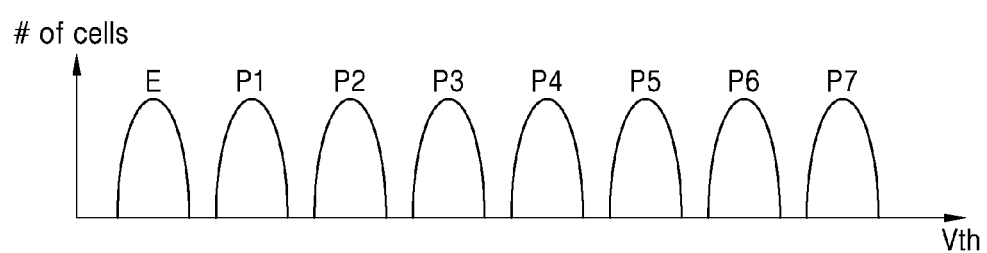
FIGS. 10A, 10B and 10C are respective threshold voltage distribution diagrams further illustrating the programming of memory cells according to embodiments of the inventive concept.
Figure 10B:
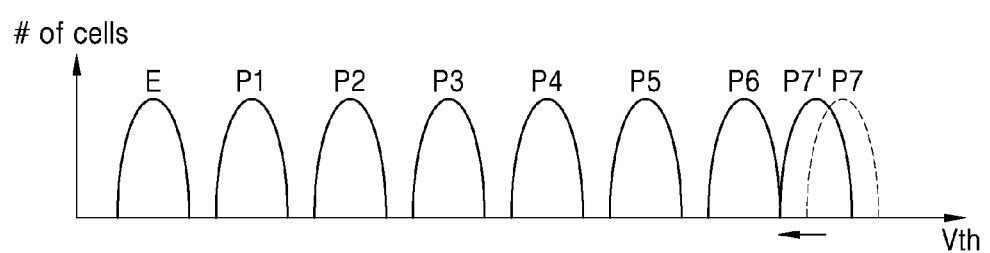
Figure 10C:
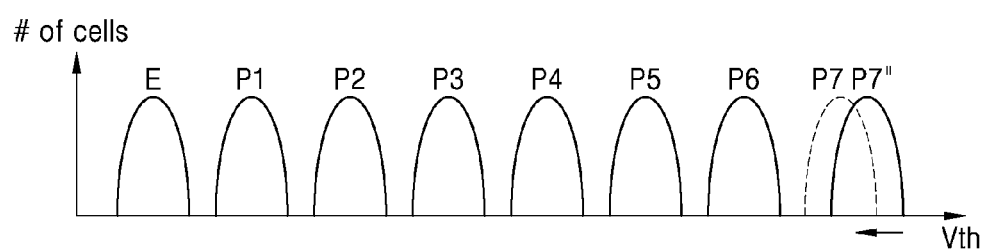

FIGS. 10A, 10B and 10C are respective graphs showing threshold voltage distributions of TLC according to embodiments of the inventive concept.

Referring to FIG. 10A, the TLC may have one of eight (8) possible states including an erase state E and a first program state P1 to a seventh program state P7. In the case of a normal cell (normally programmed), a sufficient separation interval exists between the sixth program state P6 and the seventh program state P7, for example.

However, referring to FIG. 10B and assuming the TLC is a fast cell, the seventh program state P7' may deteriorate faster than the normal cells. That is, the threshold voltage distribution of the seventh program state P7' indicated by a solid line may be left-shifted, as compared to the threshold voltage distribution of the seventh program state P7 of the normal cell indicated by a dashed line. Accordingly, a separation interval between a sixth program state P6 and the seventh program state P7' is narrowed and in extreme case may overlap. When the threshold voltage distributions overlap, it become very difficult if not impossible to accurately distinguish between the overlapping program states. As a result, the reliability of a read operation or a verify operation may be deteriorated.

Referring to FIG. 10C and consistent with embodiments of the inventive concept, when fast cells are over-programmed, the threshold voltage level of the fast cell is right-shifted compared to the threshold voltage level of the normal cell. That is, the over-program voltage may be applied to the fast cell so that the threshold voltage distribution of the fast cell in the seventh program state P7" indicated by the solid line is shifted to the right compared to the threshold voltage distribution of the normal cell in the 7th program state P7 indicated by the dashed line. Accordingly, even if the threshold voltage distribution in the seventh program state P7 is shifted to the left due to some deterioration, it is possible to prevent overlapping with the threshold voltage distribution in the sixth program state P6.

Figure 11:
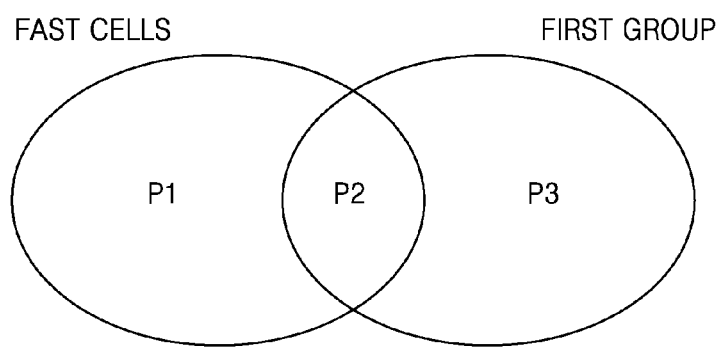
FIG. 11 is a conceptual diagram further illustrating an over-program operation according to embodiments of the inventive concept.

FIG. 11 is a conceptual diagram illustrating a collection of memory cells in relation to an over-program operation according to embodiments of the inventive concept.

Hereinafter, it is assumed that a memory system has already detected and stored fast cell information.

Referring to FIGS. 1 and 11, memory cells requiring over-programming are not limited to fast cells. That is, the memory system 10 may determine not only the memory cells determined to be fast cells, but also various memory cells as target cells through the above-described embodiment.

As an example, the memory system 10 may detect, as a first group, memory cells that are expected to rapidly deteriorate due to structural or environmental characteristics among the memory cells. For example, when the memory cell array 210 is implemented in three dimensions, there may be memory cells having a high program and erase speed depending on structural characteristics. As an example, memory cells located outside the channel hole arrangement may be included in the first group. Meanwhile, information on memory cells classified into the first group may be stored in a buffer.

As another example, the memory system 10 may detect memory cells having an arbitrary program state as a first group. For example, among the memory cells of the memory cell array 210, memory cells in the seventh program state P7 may be detected as the first group.

As another example, when the memory system 10 receives a program request from the host, the memory cells to be programmed may be detected as the first group. The method, performed by the memory system 10, of detecting the first group is not limited to only one method.

The memory system 10 may perform a set operation on the fast cell set and the first group to determine a target cell. For example, the memory system 10 may determine memory cells P1, P2, and P3 corresponding to union of the fast cell set and the first group as target cells. As another example, the memory system 10 may determine memory cells corresponding to a difference of sets or a symmetric difference of sets of the fast cell set and the first group as the target cells. The memory cells P1 or P3 may be determined to be target cells through a difference operation, and the memory cells P1 and P3 may be determined to be target cells through a symmetric difference operation.

The memory system 10 may perform an over-program operation on the determined target cells. Meanwhile, as a result of performing the set operation, a group of the target cells may be determined to be an empty set, and in this case, it may mean that there is no memory cell in the memory cell array 210 on which the over-program operation is to be performed. At this time, when the memory system 10 receives a program request for arbitrary memory cells, a normal program operation may be performed on all memory cells to be programmed.

Figure 12:
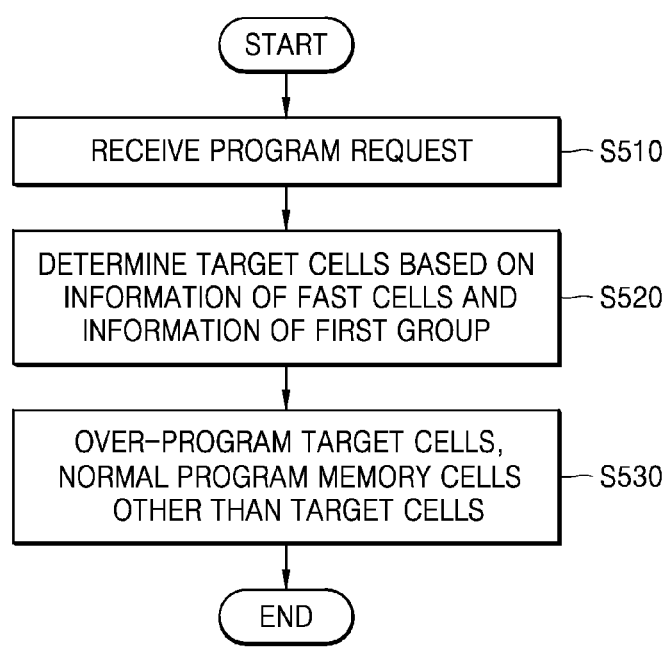
FIG. 12 is a flowchart illustrating a program operation according to embodiments of the inventive concept.

FIG. 12 is a flowchart illustrating a program operation according to embodiments of the inventive concept.

Referring to FIGS. 1 and 12, the memory system 10 may receive a program request from the host (S510). The program request may include information on memory cells to be programmed.

The memory system 10 may determine target cells based on the stored fast cell information and the first group information (S520). A set operation may be performed to determine the target cells. The memory system 10 may perform the set operation on only the fast cells among the memory cells to be programmed or memory cells belonging to the first group.

Here, step (S520) may be performed before step (S510), and in this case, because the memory system 10 is before receiving information on the memory cells to be programmed (target cells) from the host, the set operation to determine the target cells may be performed on all memory cells.

The memory system 10 may perform an over-program operation on the determined target cells and may perform a normal program operation on the normal cells other than the target cells (S530).

Figure 13:
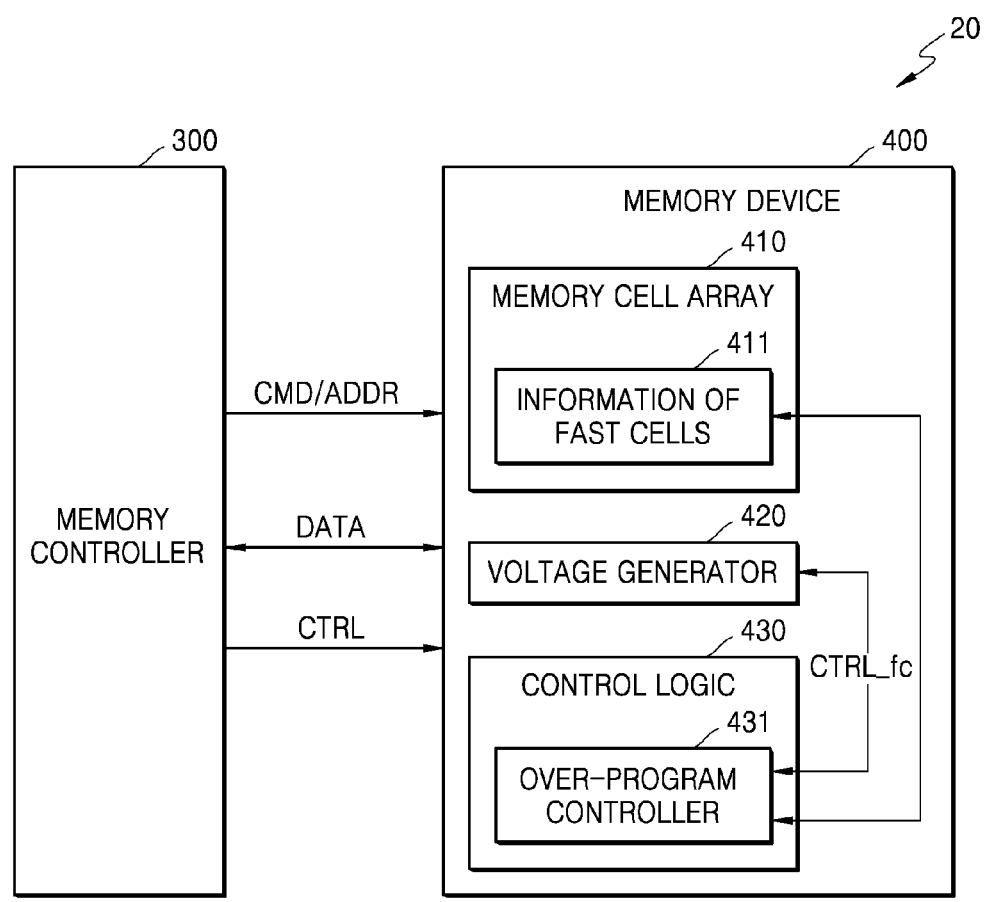
FIG. 13 is a block diagram illustrating a memory system 20 according to a deformable embodiment of the inventive concept.

FIG. 13 is a block diagram illustrating a modifiable memory system according to embodiments of the inventive concept.

Referring to FIG. 13, a memory system 20 may include a memory controller 300 and a memory device 400, and the memory device 400 may include a memory cell array 410 including fast cell information, a voltage generator 420, and a control logic 430 including an over-program controller 431. In addition, the memory controller 300 may provide a command/address CMD/ADDR to the memory device 400, transmit and receive data to and from the memory device 400, and provide a control signal CTRL for controlling a memory operation to the memory device 400.

The over-program controller 431 may detect a fast cell in the memory cell array 410 and generate a fast cell control signal CTRL_fc for over-programming the fast cell. The fast cell control signal CTRL_fc may include a first control signal for detecting a fast cell and a second control signal for over-programming the fast cell.

The over-program controller 431 may generate the first control signal and provide the generated first control signal to the voltage generator 420. The voltage generator 420 may apply a program voltage, an erase voltage, and an erase verification voltage included in the first control signal to the memory cell. For example, a voltage for preprogramming, a voltage for soft erasing, and a voltage for verifying the erasing may be sequentially applied to the memory cells.

The over-program controller 431 may detect a fast cell having a threshold voltage less than the third threshold voltage level V3 of FIG. 6B based on the threshold voltage distribution of the memory cells formed as a result of the verification of the erasing. The detected fast cell information may be stored in a certain block of the memory cell array 410. The fast cell information may include the address of the fast cell.

The memory device 400 may determine memory cells to be programmed in which data is to be written based on an address ADDR provided with a program command from the memory controller 300. The over-program controller 431 may check whether a fast cell is included among the memory cells to be programmed based on the address.

When a fast cell is included, the over-program controller 431 may generate the second control signal for performing an over-program operation on the fast cells. The second control signal may include information on at least one of the ISPP voltage level and the number of ISPP voltage pulses. For example, referring to FIGS. 9A to 9D, the second control signal may include at least one of the number of ISPP voltage pulses applied to the fast cell M, an ISPP start voltage level V3', an increase amount of the ISPP voltage pulse V4', and a level of program verification voltage V5'.

The voltage generator 420 may generate a voltage for over-programming fast cells based on the second control signal and apply the generated voltage to the fast cells. The voltage generator 420 may generate a voltage for normal programming normal cells other than the fast cells among the memory cells to be programmed and apply the generated voltage for the normal programming to the normal cells.

That is, a fast cell detection operation of the memory device 400 may be performed after receiving a program command from the memory controller 300. In this case, the over-program controller 431 may perform the fast cell detection operation on all memory cells or memory cells to be programmed of the memory cell array 410. Accordingly, detection results of all memory cells or detection results of memory cells to be programmed may be stored in a certain block in which fast cell information of the memory cell array 410 is stored.

Figure 14:
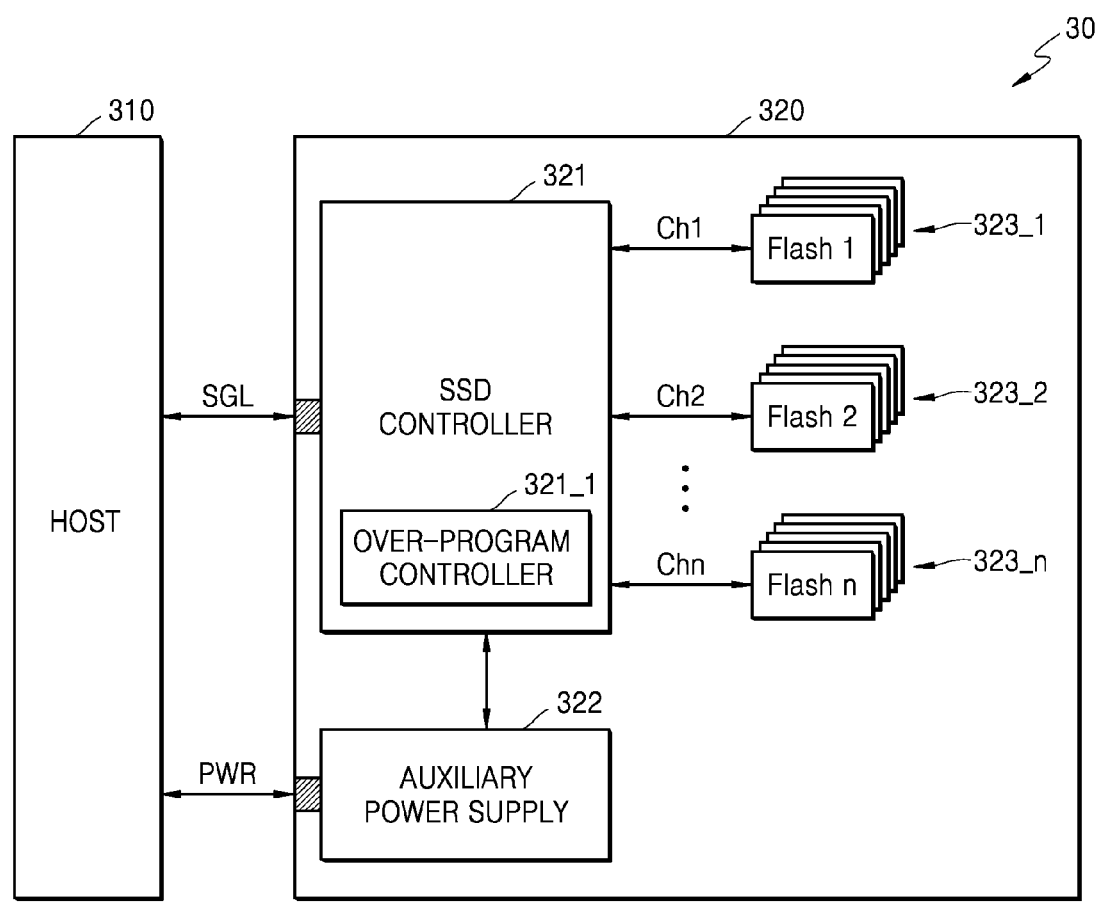
FIG. 14 is a block diagram illustrating a memory device according to embodiments of the inventive concept, as applied to an Solid-State Drive (SSD) system.

FIG. 14 is a block diagram illustrating a memory device including a Solid-State Drive (SSD) according to embodiments of the inventive concept.

Referring to FIG. 14, an SSD system 30 may include a host 310 and an SSD 320. The SSD 320 may exchange signals with the host 310 through a signal connector, and may receive power through a power connector. The SSD 320 may include an SSD controller 321, an auxiliary power supply 322, and memory devices 323_1 to 323_n. In this case, the SSD 320 may be implemented using the embodiments described above with reference to FIGS. 1 to 13. According to an embodiment, the SSD controller 321 may include an over-program controller 321_1.

The above-described embodiments may be applied to the SSD system 30 shown in FIG. 14, and the SSD controller 321 may detect whether memory cells included in the memory devices 323_1 to 323_n are fast cells having a high possibility of deterioration, and may perform an over-program operation for increasing a threshold voltage level for the fast cells.

The over-program controller 321_1 may include a component that generates a control signal including information on a series of voltages applied to the memory cells to detect the fast cell.

Each of the memory devices 323_1 to 323_n may apply a series of voltages to the memory cells according to a control signal, and the over-program controller 321_1 may detect the fast cell based on the threshold voltage levels of the memory cells.

Because the fast cell refers to a memory cell of which threshold voltage distribution is expected to be shifted to the left, the SSD controller 321 may improve data reliability by programming the threshold voltage distribution to be shifted to the right through an over-program operation.

While the inventive concept has been particularly shown and described with reference to embodiments thereof, it will be understood that various changes in form and details may be made therein without departing from the spirit and scope of the following claims.

What is claimed is:

1. A method of operating a memory system including memory cells, the method comprising:
preprogramming and erasing the memory cells to set a first threshold voltage distribution for the memory cells;
detecting fast cells among the memory cells set in the first threshold voltage distribution, wherein normal cells among the memory cells each have a threshold voltage equal to or greater than a first threshold voltage, and the fast cells each have a threshold voltage less than or equal to a second threshold voltage which is less than the first threshold voltage; and
programming the memory cells set in the first threshold voltage distribution to a second threshold voltage distribution greater than the first threshold voltage distribution, said programming comprising,
  normal programming the normal cells to the second threshold voltage distribution by applying a sequence of incremental step pulse program (ISPP) voltage pulses to the normal cells, and
  over-programming the fast cells to the second threshold voltage distribution by applying the sequence of ISPP voltage pulses to the fast cells,
  wherein a voltage of an ISPP voltage pulse applied during over-programming is greater than a voltage of a corresponding ISPP voltage pulse applied during normal programming, and
  wherein a level of a verification voltage applied during the over-programming is greater than a level of a corresponding verification voltage applied during the normal programming.

2. The method of claim 1, wherein an increment step of the ISPP voltage pulses applied during over-programming is greater than an increment step of the ISPP voltage pulses applied during the normal programming.

3. The method of claim 1, wherein a voltage level of a first ISPP voltage pulse applied during the over-programming is greater than a voltage level of a first ISPP voltage pulse applied during the normal programming.

4. The method of claim 1, wherein an erase speed for the fast cells is faster than an erase speed for the normal cells.

5. A memory controller of a memory device including memory cells, the memory controller comprising:
  an over-program controller configured to preprogram the memory cells in preprogramming and then erase the memory cells to set the memory cells in a first threshold voltage distribution, and to detect fast cells among the memory cells set in the first program distribution, wherein normal cells among the memory cells each have a threshold voltage equal to or greater than a first threshold voltage, and the fast cells each have a threshold voltage less than or equal to a second threshold voltage less than the first threshold voltage; and
  a processor configured to generate fast cell information identifying the fast cells among the memory cells and store the fast cell information in a buffer,
  wherein the over-program controller is further configured to control programming of the memory cells from the first threshold voltage distribution to a second threshold voltage distribution greater than the first threshold voltage distribution with reference to the fast cell information stored in the buffer, wherein the programming comprises:
    normal programming the normal cells to the second threshold voltage distribution by applying a sequence of incremental step pulse program (ISPP) voltage pulses to the normal cells, and
    over-programming the fast cells to the second threshold voltage distribution by applying the sequence of ISPP voltage pulses to the fast cells,
    wherein a voltage of an ISPP voltage pulses applied during over-programming is greater than a voltage of a corresponding ISPP voltage pulse applied during normal programming, and
    wherein a level of a verification voltage applied during the over-programming is greater than a level of a corresponding verification voltage applied during the normal programming.

6. The memory controller of claim 5, further comprising:
  a host interface configured to receive a program request identifying the memory cells and memory cell information characterizing the memory cells,
  wherein the over-program controller determines first target cells among the memory cells based on the memory cell information on the fast cell information.

7. The memory controller of claim 6, wherein the first target cells correspond to any one of an intersection, union, difference, and symmetric difference between sets of the fast cells and second target cells.

8. The memory controller of claim 7, wherein the second target cells include at least one of the memory cells to be programmed and at least one memory cell at a predetermined position in a memory cell array of the memory device.

9. The memory controller of claim 6, wherein the over-program controller is further configured to control the memory device such that threshold voltage levels of memory cells in a first program state among the first target cells are set to a second threshold voltage level greater than the first threshold voltage level.

10. The memory controller of claim 9, wherein the memory cells are triple level memory cells (TLC), and the first program state is a seventh program state P7 for the TLC.

11. The memory controller of claim 6, wherein the memory cell information includes position information identifying a position for each memory cell relative to a channel hole, and
  the over-program controller is further configured to determine the first target cells based on the position information.

12. A memory device comprising:
  a memory cell array including a first block of first memory cells and a second block of second memory cells; and
  control logic configured to preprogram and then erase the first memory cells such that each of the first memory cells has a first threshold voltage level, wherein fast cells are detected among the memory cells according to a threshold voltage less than or equal to a second threshold voltage less than the first threshold voltage,
  wherein the control logic is further configured to generate fast cell information associated with the fast cells and store the fast cell information in the second block, and upon receiving a program command directed to the first memory cells, over-programming the fast cells by referencing the fast cell information stored in the second memory cells, and
  wherein the control logic is further configured to compare a number of the fast cells to a reference threshold value, and
  stores the fast cell information in the second memory cells block only if the number of fast cells is greater than the reference threshold value.

13. The memory device of claim 12, wherein a threshold voltage level for the fast cells following the over-programming is greater than a threshold voltage level following a normal programming of normal cells among the first memory cells.

14. The memory device of claim 13, wherein the over-programming and the normal programming are respectively performed using an incremental step pulse program (ISPP) method, and
  the control logic is further configured to increase at least one of an increment step for voltage pulses, a start voltage level for a voltage pulse, a number of voltage pulses, and a level of a verification voltage.

15. The memory controller of claim 5, wherein a voltage level of a first ISPP voltage pulse applied during the over-programming is greater than a voltage level of a first ISPP voltage pulse applied during the normal programming.

* * * * *